(12) United States Patent
Goh et al.

(10) Patent No.: US 10,785,872 B2
(45) Date of Patent: Sep. 22, 2020

(54) PACKAGE JUMPER INTERCONNECT

(71) Applicant: Intel Corporation, Santa Clara, CA (US)

(72) Inventors: Eng Huat Goh, Penang (MY); Hoay Tien Teoh, Paya Terubong (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/263,370

(22) Filed: Jan. 31, 2019

(65) Prior Publication Data
US 2019/0306978 A1 Oct. 3, 2019

(30) Foreign Application Priority Data

Mar. 30, 2018 (MY) .......................... PI 2018701319

(51) Int. Cl.
| | |
|---|---|
| *H05K 1/11* | (2006.01) |
| *H05K 1/02* | (2006.01) |
| *H01L 23/538* | (2006.01) |
| *H01L 23/00* | (2006.01) |
| *H01L 25/18* | (2006.01) |

(52) U.S. Cl.
CPC .......... *H05K 1/117* (2013.01); *H01L 23/5386* (2013.01); *H01L 24/09* (2013.01); *H01L 24/17* (2013.01); *H01L 25/18* (2013.01); *H05K 1/0213* (2013.01); *H05K 2201/0367* (2013.01); *H05K 2201/10189* (2013.01)

(58) Field of Classification Search
CPC ......... H05K 1/183; H05K 2201/09072; H05K 2201/10363; H05K 1/181; H01K 3/4697; H01L 23/5381; H01L 2924/19106
See application file for complete search history.

(56) References Cited

U.S. PATENT DOCUMENTS

| | | | | |
|---|---|---|---|---|
| 2015/0318236 | A1* | 11/2015 | Zhang | H01L 23/49838 257/773 |
| 2016/0165724 | A1* | 6/2016 | Wells | H05K 1/115 361/679.31 |
| 2016/0233922 | A1* | 8/2016 | Huang | H01L 23/5382 |

\* cited by examiner

*Primary Examiner* — Alia Sabur
(74) *Attorney, Agent, or Firm* — Schwegman Lundberg & Woessner, P.A.

(57) ABSTRACT

A jumper may be adapted to transmit an electrical signal. The jumper may be included in a system on a chip. The system on a chip may include a substrate, and the substrate may include one or more routing layers. The jumper may be included in the one or more routing layers of the substrate. A first interconnect may be positioned on a first side of the system on a chip, and a second interconnect may be positioned on a second side of the system on a chip. The jumper may be in electrical communication with the first interconnect, and may be in electrical communication with the second interconnect. The jumper may be electrically isolated from other components of the system on a chip, such as one or more die coupled to the substrate.

10 Claims, 5 Drawing Sheets

PACKAGE JUMPER INTERCONNECT

PRIORITY

This application claims the benefit of priority to Malaysian Application Serial Number PI 2018701319, filed Mar. 30, 2018, which is incorporated herein by reference in its entirety.

BACKGROUND

An electronic device may include a motherboard, and the motherboard may define a cavity (e.g., the motherboard may include a hole, or a recess, in the motherboard). The inclusion of the cavity in the motherboard may increase the difficulty of routing electrical signals in a region proximate the cavity, such as by limiting the area for routing traces to be included in the motherboard proximate the cavity. The dimensions of the motherboard that defines the cavity may be expanded to help provide the same number of routing pathways for electrical signals, in comparison to dimensions of a motherboard that does not include a cavity.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
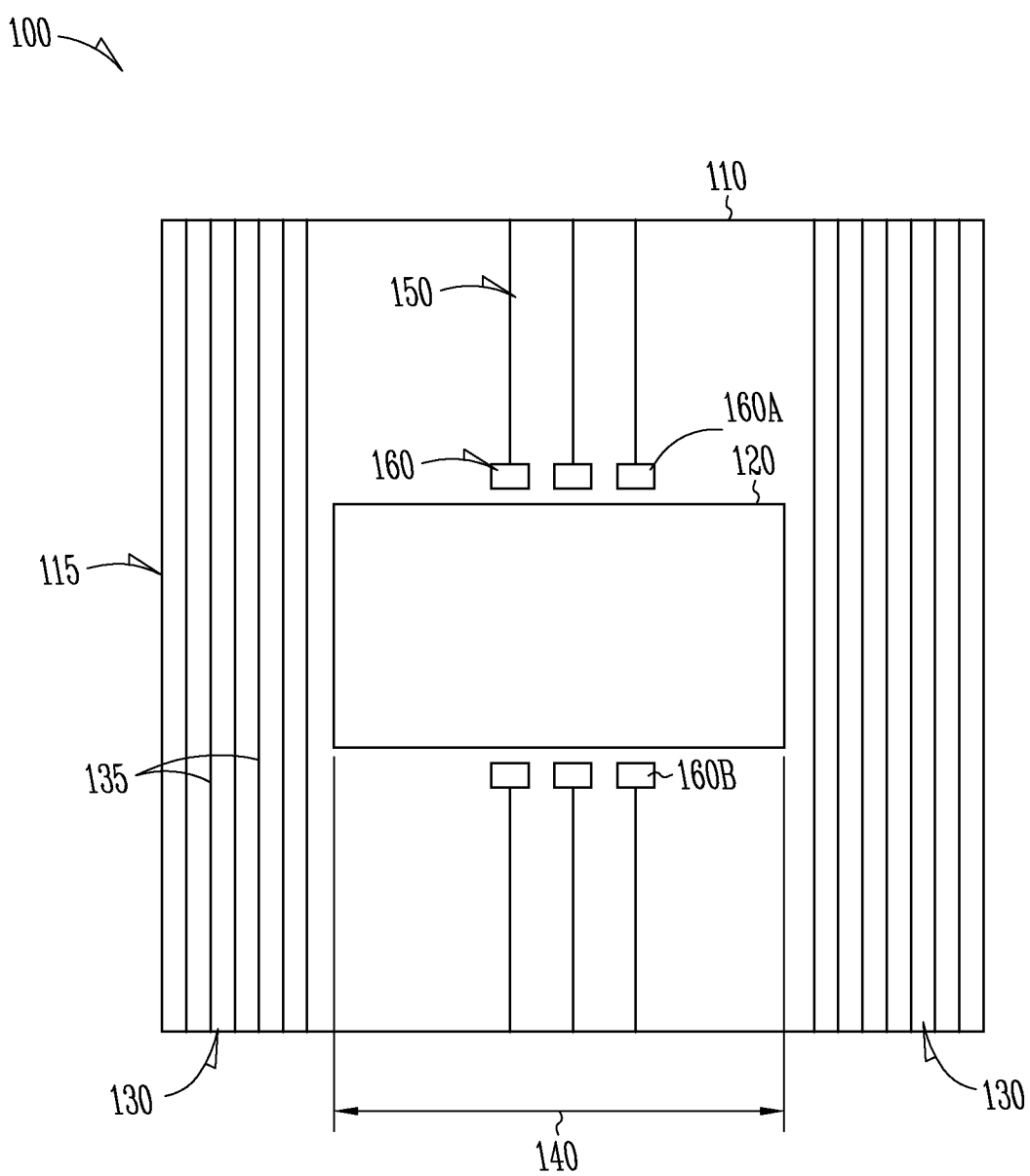
FIG. 1 illustrates a schematic view of one example of a portion of a motherboard.

The present inventors have recognized, among other things, that a problem to be solved may include routing electrical signals in a region proximate a cavity in a motherboard. The present subject matter may help provide a solution to this problem, such as by a jumper. The jumper may be adapted to help transmit an electrical signal.

The jumper may be included in a system on a chip. The system on a chip may include a substrate, and the substrate may include one or more routing layers. The jumper may be included in the one or more routing layers of the substrate. A first interconnect may be positioned on a first side of the system on a chip, and a second interconnect may be positioned on a second side of the system on a chip. The jumper may be in electrical communication with the first interconnect, and may be in electrical communication with the second interconnect. The jumper may be electrically isolated from other components of (or included in) the system on a chip, such as one or more die coupled to the substrate. The jumper may act as a bypass (e.g., pass-through) for electrical signals, such that the electrical signals are transmitted through the jumper only and do not interact with the other components of the system on a chip.

The jumper may help facilitate the electrical communication of a motherboard, such as by routing electrical signals in the region proximate the cavity in the motherboard. In an example, routing traces cannot be included in the region proximate the cavity in the motherboard because the motherboard is not continuous in the cavity (e.g., the cavity is a hole that extends through a thickness of the motherboard). The jumper may help route signals in the region proximate the cavity because routing traces may be included in the motherboard, and the routing traces may be positioned proximate the cavity. The routing traces may be in electrical communication with interconnects on a surface of the motherboard, and the jumper may be in electrical communication with the interconnects on the surface of the motherboard. The jumper may help transmit electrical signals in the routing traces that are proximate the cavity, such as by allowing the electrical signals to be routed in a region proximate of the cavity. The jumper may help the electrical signals bypass the cavity.

In contrast, the dimensions of the motherboard may be increased (e.g., by increasing a width of the motherboard, or increasing the number of routing layers in the motherboard) to help compensate for the inability to route signals in the region proximate the cavity in the motherboard. The jumper may help maintain the same number of electrical communication pathways (e.g. routing or wiring traces) in the motherboard with the cavity without having to increase the dimensions of the motherboard, increase the density of the electrical communication pathways in the motherboard, and/or decrease dimensions of the electrical communication pathways.

This overview is intended to provide an overview of subject matter of the present patent application. It is not intended to provide an exclusive or exhaustive explanation of the invention.

Figure 2:
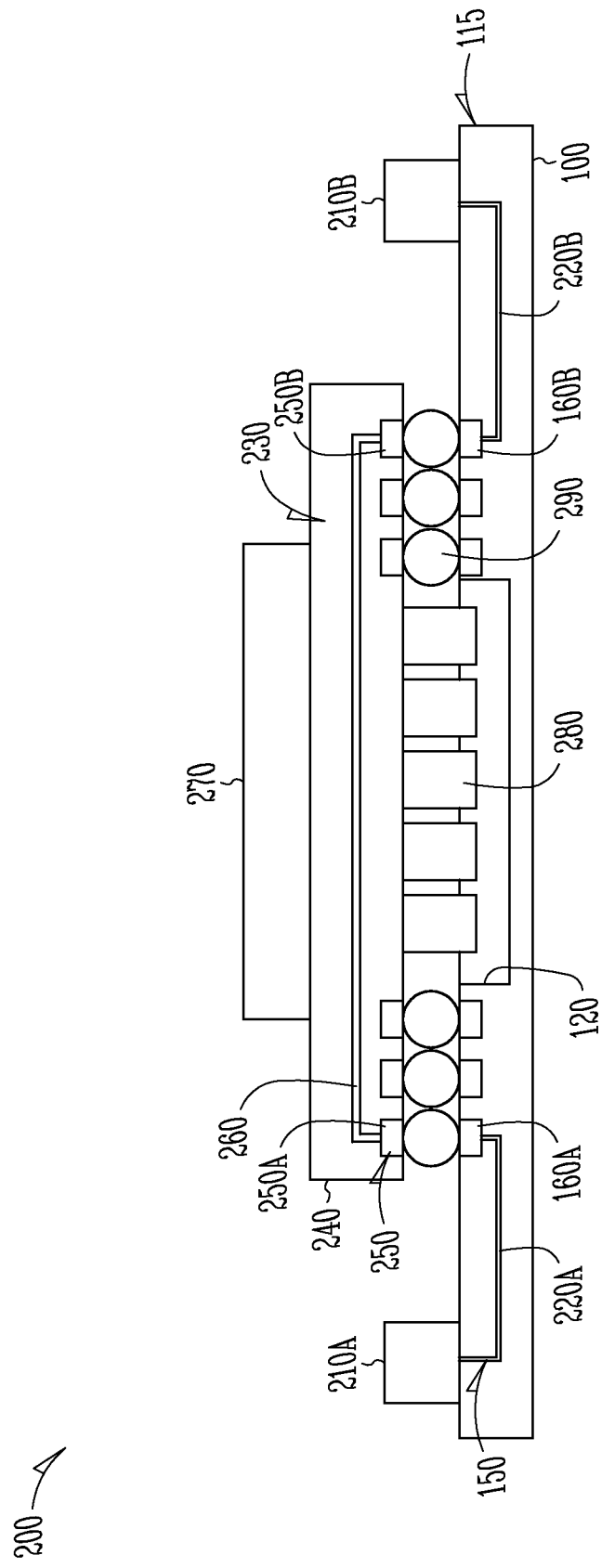
FIG. 2 illustrates a schematic view of one example of an electronic device.

FIG. 1 illustrates a schematic view of one example of a portion of a motherboard 100 that may include a substrate 110. The motherboard 100 may define a cavity 120, such as in the substrate 110. As described in further detail herein, the cavity 120 may be adapted to receive electrical components of a system on a chip (e.g., the system on a chip 230 of FIG. 2). The reception of the electrical components by the cavity 120 may help reduce an overall height of an electronic device (e.g., the electronic device 200 of FIG. 2). The cavity 120 may extend through a thickness of the motherboard (e.g., the cavity 120 is a through-hole in the substrate 110). The cavity 120 may extend partially through the thickness of the motherboard 100 (e.g., the cavity 120 may be a recess, or well, in a surface of the substrate 110 such that the cavity 120 is not a through-hole). FIG. 2 shows one example of the motherboard 100, wherein the cavity 120 extends partially through the thickness of the motherboard 100.

Referring again to FIG. 1, the substrate 110 of the motherboard 100 may include one or more routing layers 115 (e.g., a layer of conductive material coupled with a layer of dielectric material). The one or more routing layers 115 may include a first set of interconnects 130. The first set of interconnects 130 may include routing traces 135 adapted to help transmit electrical signals, such as electrical signals between components (e.g., passive components, such as capacitors, inductors, resistors, or the like) of the motherboard 100. The first set of interconnects 130 may be positioned proximate the cavity 120. The first set of interconnects 130 may be positioned outside a region 140 where the routing traces 135 would intersect with the cavity 120. The first set of interconnects 130 may be continuous from a first side of the cavity 120 to a second side of the cavity 120. In an example the routing traces 135 are positioned on a side of the cavity 120, and the routing traces 135 run along a length of the cavity 120.

The one or more routing layers 115 may include a second set of interconnects 150. The second set of interconnects 150 may include routing traces 155 adapted to help transmit electrical signals, such as electrical signals between components of the motherboard 100. The second set of interconnects 150 may be positioned proximate the cavity 120. The second set of interconnects 150 may be positioned inside the region 140 where the routing traces 155 would intersect with the cavity 120.

The second set of interconnects 150 may include a first pad 160A and may include a second pad 160B. The first pad 160A and the second pad 160B may be included in a plurality of pads 160. The pads 160 may be in electrical communication with the routing traces 155. The pads 160 may be positioned in the region 140. The pads 160 may be positioned proximate the cavity 120. The pads 160 may be positioned at a periphery (e.g., near an edge) of the cavity 120. The first pad 160A may be positioned on a first side (e.g., left) of the cavity 120, and the second pad 160B may be positioned on a second (e.g., right) side of the cavity 120. The pads 160 may be positioned on additional sides of the cavity 120 (e.g., surround, or substantially occupy the space around the cavity 120).

The pads 160 may be coplanar with a surface (e.g. a top or bottom surface) of the substrate 110. The pads 160 may be exposed on the surface of the motherboard 100. The pads 160 may be adapted to help interconnect with additional components, such as a system on a chip (e.g., the system on a chip 230 of FIG. 2). The pads 160 may be arranged in an array. The second set of interconnects 150 may include a ball grid array, a pin grid array, a land grid array, or the like. The pads 160 may be arranged at a first pitch, or arranged at a second pitch.

FIG. 2 illustrates a schematic view of one example of an electronic device 200. The electronic device 200 may include the motherboard 100. The motherboard 100 may include a first motherboard component 210A and may include a second motherboard component 210B. The first motherboard component 210A and the second motherboard component 210B may be included in a plurality of motherboard components. The first motherboard component 210A and the second motherboard component 210B may include passive electrical components (e.g., resistors, capacitors, inductors, or the like) or may include active electrical components (e.g., diodes, transistors, integrated circuits, power sources, or the like).

As discussed herein the motherboard 100 may include the second set of interconnects 150. The second set of interconnects 150 may include a first routing trace 220A and may include a second routing trace 220B. The first routing trace 220A and the second routing trace 220B may be adapted to help transmit electrical signals to and from the first motherboard component 210A and the second motherboard component 210B, respectively. The first routing trace 220A may be in electrical communication with the first motherboard component 210A, and may be in electrical communication with the first pad 160A. The first routing trace 220A may be positioned on a first side of the cavity 120 in the motherboard 100. The first pad 160A may be positioned proximate the cavity 120. The second routing trace 220B may be in electrical communication with the second motherboard component 210B, and may be in electrical communication with the second pad 160B. The second routing trace 220B may be positioned on a second side of the cavity 120. The second pad 160B may be positioned proximate the cavity 120.

The electronic device 200 may include a system on a chip ("SOC") 230. The system on a chip 230 may include a substrate 240. The substrate 240 may include SOC interconnects 250 that may be adapted to help transmit electrical signals. The SOC interconnects 250 may include a first pad 250A and may include a second pad 250B. The first pad 250A may be positioned on a first side (e.g., with respect to the cavity 120, such as to the left of the cavity 120) of the system on a chip 230. The second pad 250B may be positioned on a second side of the system on a chip 230. The SOC interconnects 250 may correspond with (e.g., have corresponding arrangements as) the second set of interconnects 150 of the motherboard 100.

The system on a chip 230 may include a jumper 260 that may be adapted to help transmit electrical signals, such as between the first pad 250A and the second pad 250B. The jumper 260 may be electrically isolated from other components (e.g., active or passive electrical components) of the system on a chip 230, such as one or more die 270 or SOC package electrical components 280. The jumper 260 may be an isolated electrical communication pathway that may help facilitate substantially uninterrupted transmission of electrical signals through the system on a chip 230. The electrical signals transmitted through the jumper 260 may bypass the other components of the system on a chip 230. In an example, an electrical signal may enter the system on a chip 230 at the first pad 250A, transmit through the jumper 260, and exit the system on a chip 230 at the second pad 230B, without interacting with the other components included in the system on a chip 230.

The jumper 260 may be included in a plurality of jumpers. Each (e.g., the jumper 260) of the plurality of jumpers may be electrically isolated from other jumpers of the plurality of jumpers. The plurality of jumpers may be electrically isolated from the other components of the system on a chip 230. The plurality of jumpers 260 may help provide a plurality of isolated electrical communication pathways.

Referring again to FIG. 2, the system on a chip 230 may be coupled with the motherboard 100, such as with a solder ball 290. The system on a chip 230 may be in electrical communication with the motherboard 100. The system on a chip 230 may include one or more die 270. The one or more die 270 may include a semiconductor or an integrated circuit. The one or more die 270 may be positioned on a first (e.g., top) side of the substrate 240. The one or more die 270 may be in electrical communication with the motherboard 100.

The system on a chip 230 may include SOC package electrical components 280 (e.g., active or passive electrical components, such as capacitors or inductors) that may be positioned on a second (e.g., bottom) side of the substrate 240. A portion of the SOC package electrical components 280 ("SOC components 280") may be coplanar with the solder ball 290. The SOC components 280 may be in electrical communication with the motherboard 100. As shown in FIG. 2, the SOC components 280 may protrude from a surface of the substrate 110. The protrusion of the SOC components 280 from the substrate 110 may increase a height of the electronic device 200, such as by being positioned between the substrate 240 of the system on a chip 230 and the motherboard 100.

As described herein, the motherboard 100 may include a cavity 120. The cavity 120 may be sized and shaped, or otherwise adapted to, receive (e.g., accommodate) the SOC components 280 (or the one or more die 270), such as when the system on a chip 230 is coupled with the motherboard 100. The SOC components 280 may be positioned in the cavity 120 such that a portion of the SOC components 280 are coplanar with a portion of the cavity 120. The positioning of the SOC components 280 within the cavity 120 may help reduce the overall dimensions (e.g., height) of the electronic device 200 because the cavity 120 may receive the SOC components 280. The cavity 120 may help the system on a chip 230 to be positioned closer to the motherboard 100 than in contrast to a motherboard that does not include the cavity 120.

However, the cavity 120 in the motherboard 100 may increase the difficulty of routing electrical signals in the region 140 (shown in FIG. 1) proximate the cavity 120. The cavity 120 may reduce, or eliminate, the ability to route electrical signals in the region 140 proximate the cavity 120, such as by reducing, or eliminating, area to include routing traces (e.g., the routing traces 135 shown in FIG. 1) in the motherboard 100. The jumper 260 may help improve the ability to route electrical signals in the region 140 proximate the cavity 120, such as by helping to provide additional electrical communication pathways in the region 140 proximate the cavity 120 in the motherboard 100.

The jumper 260 may help electrical signals transmitted through the motherboard 100 to bypass the cavity 120 in the motherboard 100. The first motherboard component 210A may be positioned on the first side of the cavity 120 and the second motherboard component 210B may be positioned on the second side of the cavity 120. In an example where the motherboard 100 does not include the cavity 120, a routing trace may be included in the motherboard 100 and may run directly from the first motherboard component 210A to the second motherboard component 210B.

In contrast, and in an example where the motherboard 100 includes the cavity 120, the routing trace that would run directly from the first motherboard component 210A to the second motherboard component 210B may intersect the cavity 120. The intersecting of the routing trace with the cavity 120 may result in a discontinuity in area to include the routing trace. The routing trace may be rerouted (e.g., repositioned) to avoid the cavity 120. Repositioning the routing trace may correspondingly cause an increase in dimensions of the motherboard 100. Increasing the dimensions of the motherboard 100 (or the electronic device 200) may be undesirable because of product design considerations and consumer demand. The jumper 260 may help transmit electrical signals between the first motherboard component 210A and the second motherboard component 210B without having to reposition routing trace to avoid the cavity 120.

The jumper 220 may help minimize the dimensions of the motherboard 100 and/or the electronic device 200. For example, the first motherboard component 210A may be in electrical communication with the first pad 160A of the motherboard 100 through the first routing trace 220A. The second motherboard component 210B may be in electrical communication with the second pad 160B of the motherboard 100 through the second routing trace 220B. The solder ball 290 may interconnect the first pad 160A of the motherboard 100 with the first pad 250A of the system on a chip 230. The solder ball 290 may interconnect the second pad 160B of the motherboard 100 with the second pad 250B of the system on a chip 230. The jumper 260 may interconnect the first pad 250A with the second pad 250B of the system on a chip 230.

The jumper 260 may help interconnect the first motherboard component 210A with the second motherboard component 210B such that the first motherboard component 210A and the second motherboard component 210B are in electrical communication. The jumper 260 may help transmit signals in the region 140 (shown in FIG. 1) proximate the cavity 120 and may help minimize the dimensions of the motherboard 100 (or the electronic device 200).

The jumper 260 may help increase the number of electrical communication pathways that are provided in the region 140 proximate the cavity 120, and may thereby help minimize the dimensions of the motherboard 100 by providing additional electrical communication pathways for the motherboard 100 with the cavity 120 without having to increase the dimensions of the motherboard 100 with the cavity 120. The jumper 260 may be included in underutilized portions of the substrate 240 (e.g., unused routing traces that may be adapted to include the jumper 260) and help increase the number of electrical communication pathways provided for the motherboard 100 without having to increase the dimensions of the motherboard 100 (or the electronic device 200). As shown in FIG. 2, the jumper 260 may be out of plane with the motherboard 100 (e.g., the jumper may be spaced from the motherboard 100 by a distance).

Figure 3:
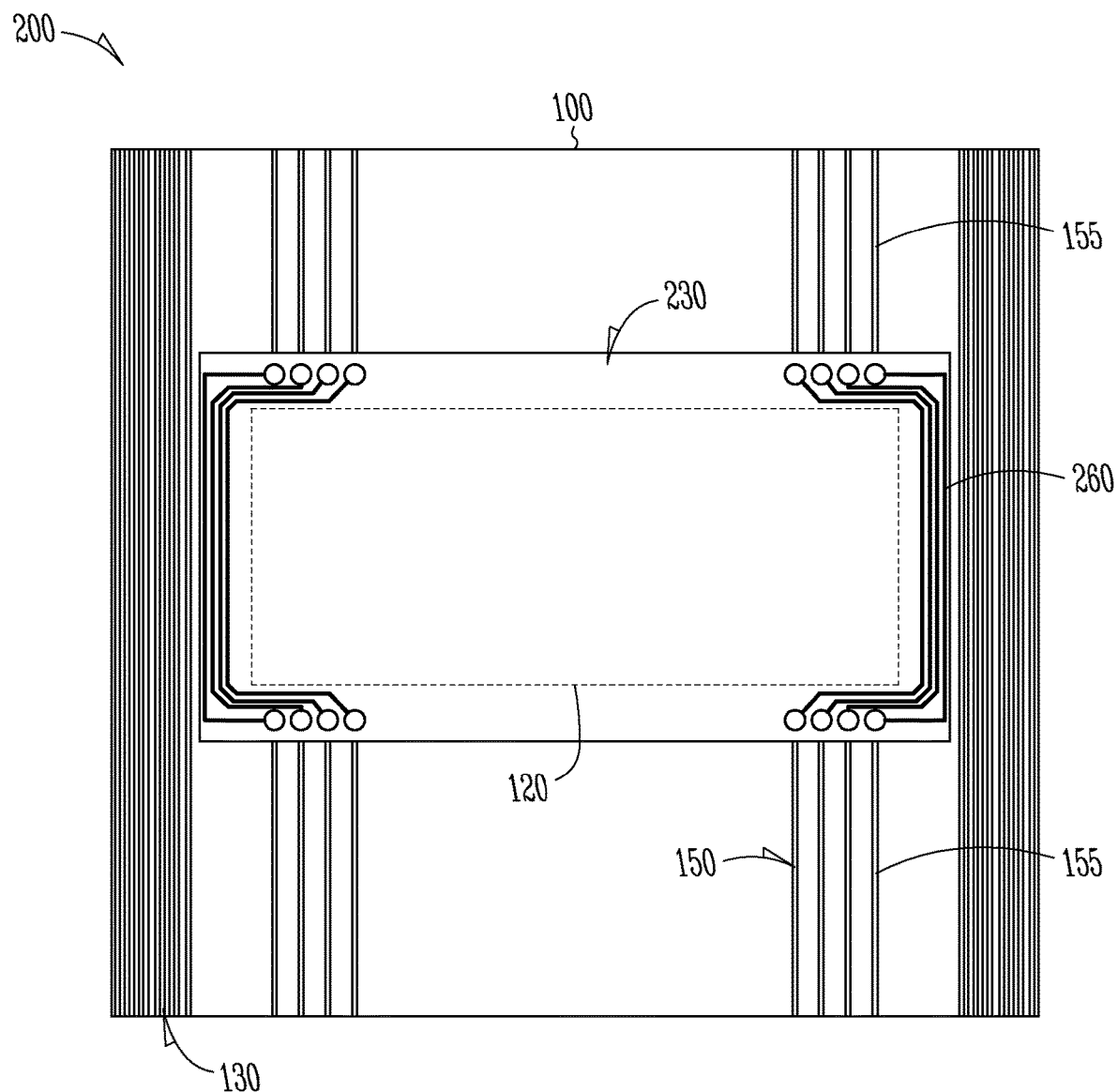
FIG. 3 illustrates a schematic view of another example of the electronic device 200 of FIG. 2.

FIG. 3 illustrates a schematic view of another example of the electronic device 200 of FIG. 2. The substrate 240 of the system on a chip 230 may be sized and shaped to span the cavity 120 in the motherboard 100. The system on a chip 230 may span across the cavity 120 such that the system on a chip 230 partially overlaps the cavity 120, or completely overlaps (e.g., covers a perimeter of) the cavity 120 in the motherboard 100. For example, FIG. 3 shows the system on a chip 230 completely overlapping the cavity 120.

As described herein, the jumper 260 may help increase the number of electrical communication pathways for the motherboard 100 and the electronic device 200. The motherboard 100 may include the first set of interconnects 130 that may run continuously proximate (e.g., do not intersect) the cavity 120 in the motherboard 100. The motherboard 100 may include the second set of interconnects 150 that may be positioned in the region 140 (shown in FIG. 1) and may electrically communicate with the jumper 260 and help transmit electrical signals in the region 140 proximate the cavity 120 in the motherboard 100. Additionally, the electronic device 200 may include a plurality of jumpers, and the plurality of jumpers may help transmit electrical signals in the region 140 proximate the cavity 120.

Figure 4:
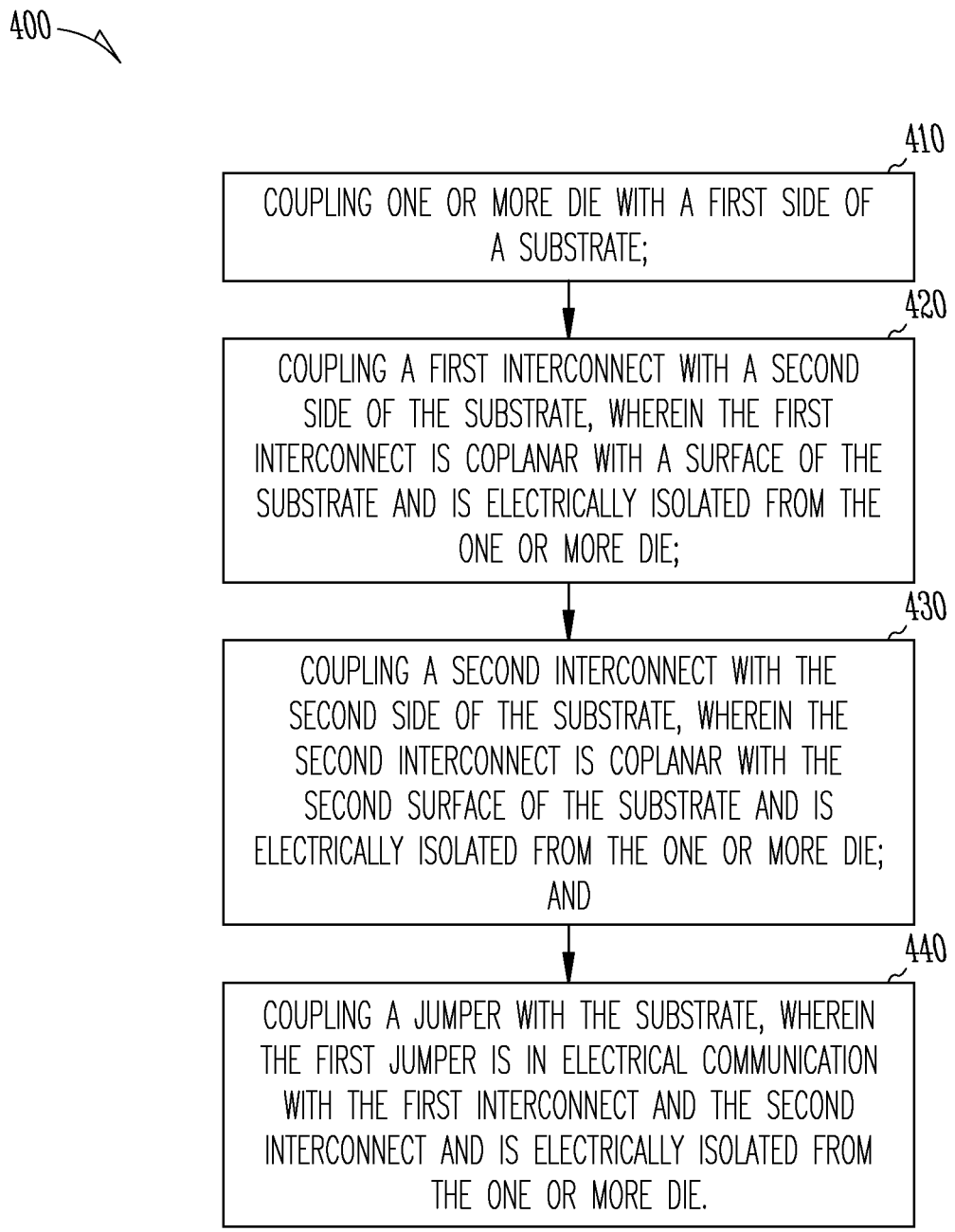
FIG. 4 illustrates an example of a method for manufacturing an electronic device.

FIG. 4 shows one example of a method 400 for manufacturing an electronic device, including the electronic devices described herein. In describing the method 400, reference is made to one or more components, features, functions and operations previously described herein. Where convenient, reference is made to the components, features, operations and the like with reference numerals. The reference numerals provided are exemplary and are not exclusive. For instance, components, features, functions, operations and the like described with respect to the method 400 include, but are not limited to, the corresponding numbered elements provided herein and other corresponding elements described herein (both numbered and unnumbered) as well as their equivalents.

At 410, one or more die 270 may be coupled to a first side of a substrate 240 (See FIG. 2). The substrate 240 and the one or more die 270 may be included in a system on a chip ("SOC") 230. SOC package electrical components 280, such as passive electrical components, may be coupled to a second side of the substrate 240. The system on a chip 230 may be coupled to a motherboard 100. The motherboard 100 may define a cavity 120. A portion of the system on a chip 230 (e.g., the SOC package electrical components 280) may be positioned within the cavity 120 defined by the motherboard 100.

At 420, the method 400 may include coupling a first interconnect (e.g., the first pad 250A of FIG. 2) with the second side of the substrate 240. The first interconnect may be coplanar with a surface of the substrate 240. The first interconnect may be positioned on a first side of the system on a chip 230. The first interconnect may be electrically isolated from the one or more die 270. The first interconnect may be electrically isolated from other electrical components of the system on a chip 230, such as the SOC package electrical components 280.

At 430, a second interconnect (e.g., the second pad 250B of FIG. 2) may be coupled with the second side of the substrate 240. The second interconnect may be coplanar with the second surface of the substrate 240. The second interconnect may be positioned on a second side of the system on a chip 230. The second interconnect may be electrically isolated from the one or more die 270. The second interconnect may be electrically isolated from other electrical components of the system on a chip 230.

At 440, a jumper 260 may be coupled with the substrate 240. The jumper 260 may be in electrical communication with the first interconnect and may be in electrical communication with the second interconnect. The jumper 260 may be electrically isolated from the one or more die 270. The jumper 260 may be electrically isolated from other electrical components of the system on a chip 230.

Figure 5:
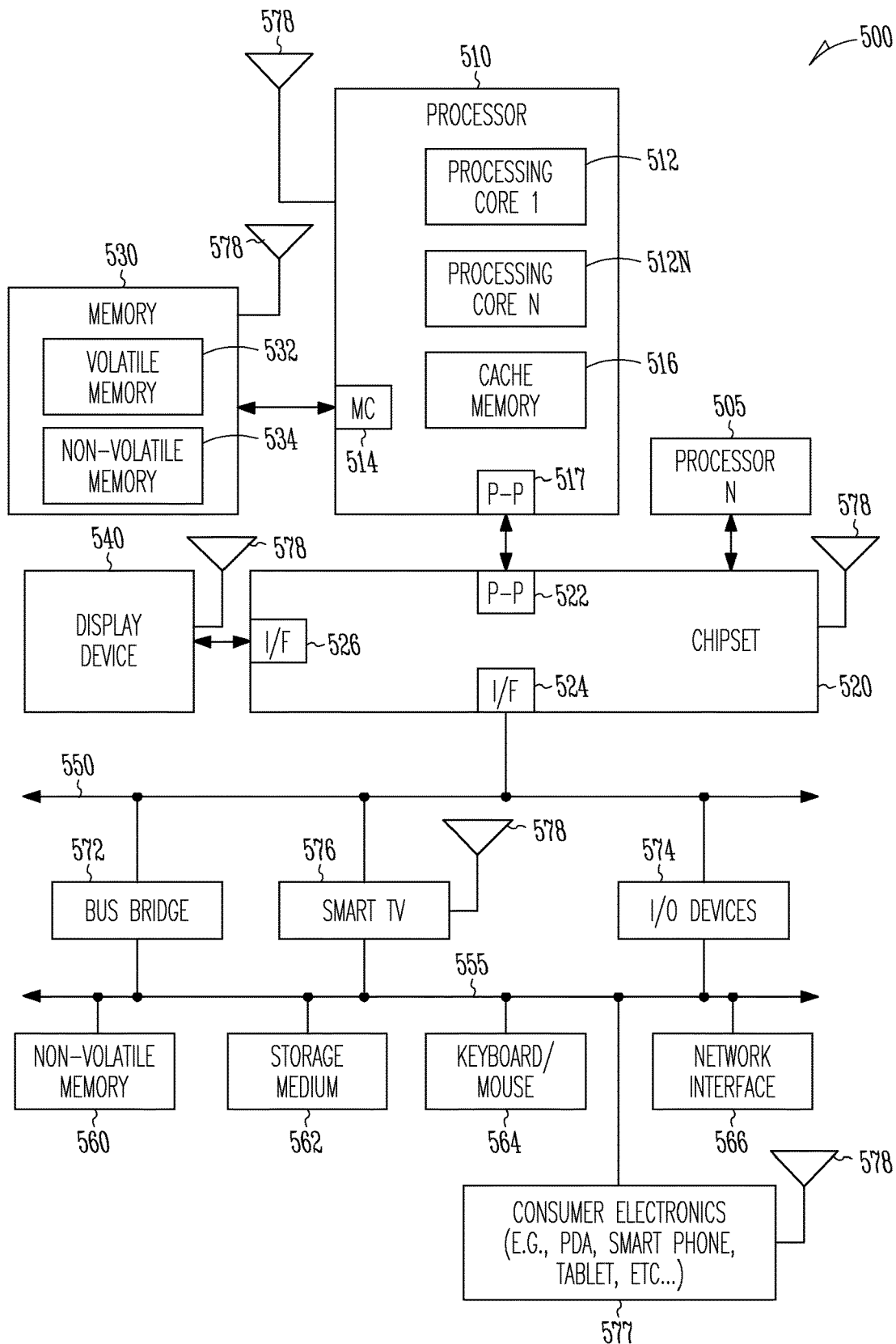
FIG. 5 illustrates a system level diagram, depicting an example of an electronic device (e.g., system) including the motherboard or the electronic device.

FIG. 5 illustrates a system level diagram, depicting an example of an electronic device (e.g., system) including the motherboard 100 or the electronic device 200, as described in the present disclosure. FIG. 5 is included to show an example of a higher level device application for the motherboard 100, the electronic device 200, the system on a chip 230, or the jumper 260. In one embodiment, system 500 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 500 is a system on a chip (SOC) system.

In one embodiment, processor 510 has one or more processor cores 512 and 512N, where 512N represents the Nth processor core inside processor 510 where N is a positive integer. In one embodiment, system 500 includes multiple processors including 510 and 505, where processor 505 has logic similar or identical to the logic of processor 510. In some embodiments, processing core 512 includes, but is not limited to, pre-fetch logic to fetch instructions, decode logic to decode the instructions, execution logic to execute instructions and the like. In some embodiments, processor 510 has a cache memory 516 to cache instructions and/or data for system 500. Cache memory 516 may be organized into a hierarchal structure including one or more levels of cache memory.

In some embodiments, processor 510 includes a memory controller 514, which is operable to perform functions that enable the processor 510 to access and communicate with memory 530 that includes a volatile memory 532 and/or a non-volatile memory 534. In some embodiments, processor 510 is coupled with memory 530 and chipset 520. Processor 510 may also be coupled to a wireless antenna 578 to communicate with any device configured to transmit and/or receive wireless signals. In one embodiment, an interface for wireless antenna 578 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 532 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 534 includes, but is not limited to, flash memory, phase change memory (PCM), read-only memory (ROM), electrically erasable programmable read-only memory (EEPROM), or any other type of non-volatile memory device.

Memory 530 stores information and instructions to be executed by processor 510. In one embodiment, memory 530 may also store temporary variables or other intermediate information while processor 510 is executing instructions. In the illustrated embodiment, chipset 520 connects with processor 510 via Point-to-Point (PtP or P-P) interfaces 517 and 522. Chipset 520 enables processor 510 to connect to other elements in system 500. In some embodiments of the example system, interfaces 517 and 522 operate in accordance with a PtP communication protocol such as the Intel® QuickPath Interconnect (QPI) or the like. In other embodiments, a different interconnect may be used.

In some embodiments, chipset 520 is operable to communicate with processor 510, 505N, display device 540, and other devices, including a bus bridge 572, a smart TV 576, I/O devices 574, nonvolatile memory 560, a storage medium (such as one or more mass storage devices) 562, a keyboard/mouse 564, a network interface 566, and various forms of consumer electronics 577 (such as a PDA, smart phone, tablet etc.), etc. In one embodiment, chipset 520 couples with these devices through an interface 524. Chipset 520 may also be coupled to a wireless antenna 578 to communicate with any device configured to transmit and/or receive wireless signals.

Chipset 520 connects to display device 540 via interface 526. Display 540 may be, for example, a liquid crystal display (LCD), a plasma display, cathode ray tube (CRT) display, or any other form of visual display device. In some embodiments of the example system, processor 510 and chipset 520 are merged into a single SOC. In addition, chipset 520 connects to one or more buses 550 and 555 that interconnect various system elements, such as I/O devices 574, nonvolatile memory 560, storage medium 562, a keyboard/mouse 564, and network interface 566. Buses 550 and 555 may be interconnected together via a bus bridge 572.

In one embodiment, mass storage device 562 includes, but is not limited to, a solid state drive, a hard disk drive, a universal serial bus flash memory drive, or any other form of computer data storage medium. In one embodiment, network interface 566 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 5 are depicted as separate blocks within the system 500, the functions performed by some of these blocks may be integrated within a single semiconductor circuit or may be implemented using two or more separate integrated circuits. For example, although cache memory 516 is depicted as a separate block within processor 510, cache memory 516 (or selected aspects of 516) can be incorporated into processor core 512.

VARIOUS NOTES & EXAMPLES

Aspect 1 may include or use subject matter (such as an apparatus, a system, a device, a method, a means for performing acts, or a device readable medium including instructions that, when performed by the device, may cause the device to perform acts, or an article of manufacture), such as may include or use a system on a chip. The system on a chip may include a substrate. The system on a chip may include one or more die that may be coupled to the substrate. The system on a chip may include one or more routing layers that may be included in the substrate.

The system on a chip may include a first interconnect. The first interconnect may be positioned on a first side of the system on a chip. The system on a chip may include a second interconnect. The second interconnect may be positioned on a second side of the system on a chip. The system on a chip may include a first jumper that may be adapted to transmit an electrical signal. The first jumper may be included in the one or more routing layers. The first jumper may be in electrical communication with the first interconnect and may be in electrical communication with the second interconnect. The first jumper may be electrically isolated from other components of the system on a chip.

Aspect 2 may include or use, or may optionally be combined with the subject matter of Aspect 1, to optionally include or use that the one or more die may be positioned on a first surface of the substrate. The first interconnect may be positioned on a second surface of the substrate. The second interconnect may be positioned on the second surface of the substrate.

Aspect 3 may include or use, or may optionally be combined with the subject matter of one or any combination of Aspects 1 or 2 to optionally include or use that the first interconnect and the second interconnect may be conductive pads The conductive pads may be coplanar with the second surface of the substrate.

Aspect 4 may include or use, or may optionally be combined with the subject matter of one or any combination of Aspects 1 through 3 to optionally include or use at least one passive component. The at least one passive component may be positioned on a second surface of the substrate. The first jumper may be electrically isolated from the at least one passive component.

Aspect 5 may include or use, or may optionally be combined with the subject matter of one or any combination of Aspects 1 through 4 to optionally include or use a plurality of interconnects. The plurality of interconnects may include the first interconnect and may include the second interconnect. The plurality of interconnects may be arranged in an array on a surface of the substrate. The system on a chip may include a plurality of jumpers. The plurality of jumpers may include the first jumper. The plurality of jumpers may be electrically isolated from other components of the system on a chip.

Aspect 6 may include or use, or may optionally be combined with the subject matter of one or any combination of Aspects 1 through 5 to optionally include or use that the one or more die may include a processor die and may include a memory die.

Aspect 7 may include or use subject matter (such as an apparatus, a system, a device, a method, a means for performing acts, or a device readable medium including instructions that, when performed by the device, may cause the device to perform acts, or an article of manufacture), such as may include or use an electronic device. The electronic device may include a system on a chip ("SOC"). The system on a chip may include one or more die. The one or more die may be positioned on a first surface of a substrate. The system on a chip may include at least one package electrical component. The at least one package electrical component may be positioned on a second surface of the substrate.

The system on a chip may include a first jumper. The first jumper may be adapted to transmit an electrical signal. The first jumper may be included in the substrate. The first jumper may be electrically isolated from the one or more die. The first jumper may be electrically isolated from the at least one package electrical component.

The electronic device may include a motherboard. The motherboard may define a cavity in the motherboard. The cavity may be sized and shaped to receive the at least one package electrical component. The motherboard may include a first electronic component that may be positioned on a first side of the cavity in the motherboard. The motherboard may include a second electronic component that may be positioned on a second side of the cavity in the motherboard.

The system on a chip may be coupled with the motherboard. The system on a chip may be sized and shaped to span the cavity in the motherboard. The first electronic component that may be positioned on the first side of the cavity may be in electrical communication with the second electronic component on the second side of the cavity. The electrical communication may be facilitated by the first jumper of the system on a chip that spans the cavity in the motherboard.

Aspect 8 may include or use, or may optionally be combined with the subject matter of Aspect 7, to optionally include or use that the first jumper may be out of plane with the motherboard.

Aspect 9 may include or use, or may optionally be combined with the subject matter of one or any combination of Aspects 7 or 8 to optionally include or use a first motherboard interconnect that may be positioned proximate the cavity. The first motherboard interconnect may be positioned on the first side of the cavity in the motherboard. The electronic device may include a second motherboard interconnect that may be positioned proximate the cavity. The second motherboard interconnect may be positioned on the second side of the cavity in the motherboard.

The electronic device may include a first SOC interconnect. The first SOC interconnect may be positioned on a first side of the system on a chip. The first SOC interconnect may be adapted to couple with the first motherboard interconnect. The electronic device may include a second SOC interconnect that may be positioned on a second side of the system on a chip. The second SOC interconnect may be adapted to couple with the second motherboard interconnect. The first SOC interconnect and the second SOC interconnect may be in electrical communication through the first jumper.

Aspect 10 may include or use, or may optionally be combined with the subject matter of one or any combination of Aspects 7 through 9 to optionally include or use that the motherboard may include a plurality of motherboard interconnects that may be positioned proximate the cavity. The system on a chip may include a plurality of SOC interconnects that may correspond to the plurality of motherboard interconnects. The plurality of SOC interconnects may be coupled with the plurality of motherboard interconnects. The system on a chip may include a plurality of jumpers that includes the first jumper. The plurality of SOC interconnects may be in electrical communication with the plurality of jumpers.

Aspect 11 may include or use, or may optionally be combined with the subject matter of one or any combination of Aspects 7 through 10 to optionally include or use a solder ball. The solder ball may couple the system on a chip with the motherboard.

Aspect 12 may include or use, or may optionally be combined with the subject matter of Aspect 11 to optionally include or use that the solder ball may be coplanar with the at least one package electrical component.

Aspect 13 may include or use, or may optionally be combined with the subject matter of one or any combination of Aspects 7 through 12 to optionally include or use at least one package electrical component. The at least one package component may be positioned within the cavity in the motherboard.

Aspect 14 may include or use, or may optionally be combined with the subject matter of one or any combination of Aspects 7 through 13 to optionally include or use a first routing trace that may be included in the motherboard. The first routing trace may be positioned on the first side of the cavity in the motherboard. The first routing trace may be in electrical communication with a first motherboard interconnect. The first motherboard interconnect may be positioned proximate the cavity and on the first side of the cavity.

The electronic device may include a second routing trace that may be included in the motherboard. The second routing trace may be positioned on the second side of the cavity in the motherboard. The second routing trace may be in electrical communication with a second motherboard interconnect. The second motherboard interconnect may be positioned proximate the cavity. The second motherboard interconnect may be positioned on the second side of the cavity.

The electronic device may include a third routing trace that may be included in the motherboard. The third routing trace may be positioned proximate the cavity in the motherboard. The third routing trace may be continuous from the first side of the cavity to the second side of the cavity.

Aspect 15 may include or use, or may optionally be combined with the subject matter of Aspect 14 to optionally include or use that the first routing trace and the second routing trace may be colinear.

Aspect 16 may include or use, or may optionally be combined with the subject matter of Aspect 14 to optionally include or use that the first jumper may electrically interconnect the first routing trace and the second routing trace.

Aspect 17 may include or use subject matter (such as an apparatus, a system, a device, a method, a means for performing acts, or a device readable medium including instructions that, when performed by the device, may cause the device to perform acts, or an article of manufacture), such as may include or use a method for manufacturing a system on a chip. The method may include coupling one or more die with a first side of a substrate. The method may include coupling a first interconnect with a second side of the substrate. The first interconnect may be coplanar with a surface of the substrate and may be electrically isolated from the one or more die.

The method may include coupling a second interconnect with the second side of the substrate. The second interconnect may be coplanar with the second side of the substrate and may be electrically isolated from the one or more die. The method may include coupling a jumper with the substrate. The jumper may be in electrical communication with the first interconnect and may be in electrical communication with the second interconnect. The jumper may be electrically isolated from the one or more die.

Aspect 18 may include or use, or may optionally be combined with the subject matter of Aspect 17, to optionally include or use that the jumper, the first interconnect, and the second interconnect may be electrically isolated from other electrical components of the system on a chip.

Aspect 19 may include or use, or may optionally be combined with the subject matter of one or any combination of Aspects 17 or 18 to optionally include or use that the method may include coupling at least one passive component with the second side of the substrate.

Aspect 20 may include or use, or may optionally be combined with the subject matter of one or any combination of Aspects 17 through 19 to optionally include or use that the first interconnect may be positioned on a first side of the system on a chip. The second interconnect may be positioned on a second side of the system on a chip.

Aspect 21 may include or use, or may optionally be combined with the subject matter of one or any combination of Aspects 17 through 20 to optionally include or use that the method may include coupling the system on a chip with a motherboard.

Aspect 22 may include or use, or may optionally be combined with the subject matter of Aspect 21 to optionally include or use that the method may include positioning a portion of the system on a chip within a cavity of a motherboard.

Each of these non-limiting examples may stand on its own, or may be combined in various permutations or combinations with one or more of the other examples.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMS), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. An electronic device, comprising:
a system on a chip ("SOC") including:
one or more die positioned on a first surface of a substrate,
at least one package electrical component positioned on a second surface of the substrate, and
a first jumper adapted to transmit an electrical signal, wherein:
the first jumper is included in the substrate, and
the first jumper is electrically isolated from the one or more die and the at least one package electrical component;
a motherboard defining a cavity, wherein the cavity is sized and shaped to receive the at least one package electrical component, the motherboard including:
a first electronic component positioned on a first side of the cavity in the motherboard,
a second electronic component positioned on a second side of the cavity in the motherboard;
wherein the system on a chip is coupled with the motherboard, and the system on a chip is sized and shaped to span the cavity in the motherboard; and
wherein the first electronic component on the first side of the cavity is in electrical communication with the second electronic component on the second side of the cavity, and the electrical communication is facilitated by the first jumper of the system on a chip that spans the cavity in the motherboard.

2. The electronic device of claim 1, wherein the first jumper is out of plane with the motherboard.

3. The electronic device of claim 1, further comprising:
a first motherboard interconnect positioned proximate the cavity and on the first side of the cavity in the motherboard;
a second motherboard interconnect positioned proximate the cavity and on the second side of the cavity in the motherboard;
a first SOC interconnect positioned on a first side of the system on a chip and adapted to couple with the first motherboard interconnect;
a second SOC interconnect positioned on a second side of the system on a chip and adapted to couple with the second motherboard interconnect; and
wherein the first SOC interconnect and the second SOC interconnect are in electrical communication through the first jumper.

4. The electronic device of claim 1, wherein:
the motherboard includes a plurality of motherboard interconnects positioned proximate the cavity,
the system on a chip includes a plurality of SOC interconnects corresponding to, and coupled with, the plurality of motherboard interconnects, and
the system on a chip includes a plurality of jumpers that includes the first jumper.

5. The electronic device of claim 1, further comprising a solder ball, the solder ball coupling the system on a chip with the motherboard.

6. The electronic device of claim 5, wherein the solder ball is coplanar with the at least one package electrical component.

7. The electronic device of claim 1, wherein the at least one package electrical component is positioned within the cavity in the motherboard.

8. The electronic device of claim 1, further comprising:
a first routing trace included in the motherboard, wherein:
the first routing trace is positioned on the first side of the cavity in the motherboard, and
the first routing trace is in electrical communication with a first motherboard interconnect, and the first motherboard interconnect is positioned proximate the cavity and on the first side of the cavity;
a second routing trace included in the motherboard, wherein:

the second routing trace is positioned on the second side of the cavity in the motherboard, and the second routing trace is in electrical communication with a second motherboard interconnect, and wherein the second motherboard interconnect is positioned proximate the cavity and on the second side of the cavity; and a third routing trace included in the motherboard, wherein:

the third routing trace is positioned proximate the cavity in the motherboard, and the third routing trace is continuous from the first side of the cavity to the second side of the cavity.

9. The electronic device of claim 8, wherein the first routing trace and the second routing trace are colinear.

10. The electronic device of claim 8, wherein the first jumper electrically interconnects the first routing trace and the second routing trace.

\* \* \* \* \*